United States Patent
Liu et al.

(10) Patent No.: US 7,626,460 B2
(45) Date of Patent: Dec. 1, 2009

(54) LOW NOISE, LOW POWER AND HIGH BANDWIDTH CAPACITIVE FEEDBACK TRANS-IMPEDANCE AMPLIFIER WITH DIFFERENTIAL FET INPUT AND BIPOLAR EMITTER FOLLOWER FEEDBACK

(75) Inventors: Kanon Liu, Arcadia, CA (US); James F. Asbrock, Oceanside, CA (US)

(73) Assignee: Raytheon Company, Waltham, MA (US)

( * ) Notice: Subject to any disclaimer, the term of this patent is extended or adjusted under 35 U.S.C. 154(b) by 55 days.

(21) Appl. No.: 11/980,294

(22) Filed: Oct. 30, 2007

(65) Prior Publication Data
US 2009/0108942 A1  Apr. 30, 2009

(51) Int. Cl.
    H03F 3/16     (2006.01)
(52) U.S. Cl. ...................... 330/300
(58) Field of Classification Search ............... 330/253, 330/330
    See application file for complete search history.

(56) References Cited

U.S. PATENT DOCUMENTS

| | | | |
|---|---|---|---|
| 4,296,383 A * | 10/1981 | Jeandot et al. | 330/301 |
| 4,786,831 A | 11/1988 | Morse et al. | 307/490 |
| 4,868,902 A * | 9/1989 | Sato | 250/332 |
| 5,089,789 A * | 2/1992 | Van Tran | 330/253 |
| 6,100,759 A | 8/2000 | Sirna et al. | |
| 6,344,651 B1 | 2/2002 | Woolaway et al. | |
| 7,215,194 B2 * | 5/2007 | Kucharski et al. | 330/252 |
| 2002/0093380 A1 | 7/2002 | Cali | |
| 2007/0045519 A1 | 3/2007 | Fukuda et al. | |
| 2007/0228258 A1 | 10/2007 | Yamaguchi et al. | |

* cited by examiner

*Primary Examiner*—Robert Pascal
*Assistant Examiner*—Khiem D Nguyen
(74) *Attorney, Agent, or Firm*—Leonard A. Alkov

(57) ABSTRACT

A differential amplifier topology includes circuitry to create a higher bandwidth output using less current than an existing Capacitive Trans-Impedance Amplifier (CTIA) using an all Field Effect Transistor (FET) circuit design. A bipolar npn emitter follower in the circuit topology provides low output impedance and some degree of output inductive peaking, and the CTIA differential output is buffered by the bipolar npn emitter follower in the CTIA feedback loop such as the open-loop high voltage gain is maintained without being affected by output loads.

20 Claims, 5 Drawing Sheets

FIG.2A
FIG.2B
FIG.2

LOW NOISE, LOW POWER AND HIGH BANDWIDTH CAPACITIVE FEEDBACK TRANS-IMPEDANCE AMPLIFIER WITH DIFFERENTIAL FET INPUT AND BIPOLAR EMITTER FOLLOWER FEEDBACK

STATEMENT OF GOVERNMENT RIGHTS

This invention was made with government support under contract number FA8632-05-C-2454 awarded by the (AFRL) Air Force Research Lab, (MDA) Missile Defense Agency at Kirkland AFB in Albuquerque N.M. The government has certain rights in this invention.

TECHNICAL FIELD

This invention relates generally to a Capacitive Feedback Trans-Impedance Amplifier.

BACKGROUND OF THE INVENTION

Many radiation detectors, such as a Focal Plane Array (FPA) of infra-red (IR) radiation detectors, and Laser Radar (LADAR), output a current that must be amplified prior to signal processing. The Capacitive Transimpedance Amplifier (CTIA) is one conventional circuit that is often used for this purpose. By example, reference can be had to U.S. Pat. No. 4,786,831 entitled "Integrating Capacitively Coupled Transimpedance Amplifier", by Arthur L. Morse, Steven D. Gaalema, Ingrid M. Keimel, and Mary J. Hewitt, the disclosure of which is incorporated by reference herein in its entirety.

FPAs are typically comprised of a two-dimensional array of monolithic IR detectors. The individual detectors may be organized in a regular row and column, mosaic-type fashion. Such an array of detectors may be comprised of, as examples, HgCdTe, InSb, GaAs or doped silicon semiconductor material. The IR induced signal from each of the IR detectors is typically coupled to FPA readouts, such as a CTIA, a source follower direct readout, or a charge coupled device, where the signals are integrated over an interval of time and subsequently read out by a suitable multiplexing means.

FPA readouts are preferably constructed to exhibit low device and circuit noise characteristics for obtaining a satisfactory signal-to-noise ratio. The readouts preferably also consume low power to achieve both weight and size reduction. Readouts chips may be coupled to, or "bumped", with detector arrays using indium bump technology.

The capacitive feedback trans-impedance amplifier circuit (CTIA), is utilized in infrared and other sensing applications to integrate the current from a detector for a specified period of time. Also, the CTIA provides a stable detector bias voltage that is independent of detector current, produces a very linear signal response to input current, and has adequate signal bandwidth. However, in the design of a CTIA circuit, wide bandwidth operation and low power consumption are usually conflicting requirements.

BRIEF SUMMARY OF THE INVENTION

The foregoing and other problems are overcome, and other advantages are realized, in accordance with the presently preferred embodiments of these teachings.

In an exemplary aspect of the invention, the capacitive feedback trans-impedance amplifier circuit (CTIA), includes first and second input nodes coupled to gate inputs of first and second field effect transistors, respectively, and first and second output nodes, where said first and second output nodes are coupled to emitters of first and second bipolar transistors, respectively, each of said first and second bipolar transistors being provided in an emitter follower configuration, and where the emitters of the first and second bipolar transistors are further coupled to the gate inputs of the first and second field effect transistors, respectively.

In another exemplary aspect of the invention a readout integrated circuit comprises an array of capacitive transimpedance amplifiers individual ones of which comprise first and second input nodes coupled to gate inputs of first and second field effect transistors, respectively, and first and second output nodes, where said first and second output nodes are coupled to emitters of first and second bipolar transistors, respectively, each of said first and second bipolar transistors being provided in an emitter follower configuration.

In another exemplary aspect of the invention there is a method which includes receiving a signal on a first circuit, comprising a first and second input nodes coupled to gate inputs of first and second field effect transistors, respectively, and amplifying and outputting the received signal on a second circuit, comprising first and second output nodes, where said first and second output nodes are coupled to emitters of first and second bipolar transistors, respectively, each of said first and second bipolar transistors being provided in an emitter follower configuration.

In yet another exemplary aspect of the invention there is a capacitive trans-impedance amplifier, including means for receiving a signal on a first circuit, including a first and second input nodes coupled to gate inputs of first and second field effect transistors, respectively, and means for amplifying and outputting the received signal on a second circuit, including first and second output nodes, where said first and second output nodes are coupled to emitters of first and second bipolar transistors, respectively, each of said first and second bipolar transistors being provided in an emitter follower configuration.

In a particular embodiment of the invention, the means for receiving a signal comprises a receiver circuit. Further, wherein a particular embodiment of the invention the means for amplifying the signal comprises an amplifier and the means for outputting the signal comprises a feedback circuit.

BRIEF DESCRIPTION OF THE DRAWINGS

The foregoing and other aspects of embodiments of this invention are made more evident in the following Detailed Description of Exemplary Embodiments, when read in conjunction with the attached Drawing Figures, wherein.

DETAILED DESCRIPTION OF EXEMPLARY EMBODIMENTS

The exemplary embodiments of this invention provide a novel technique, and circuits employing that technique, for amplifying electrical signals originating from IR detectors and other signal sources. The circuits may interface between an IR detector and multiplexing electronics for a detector array.

In an exemplary aspect of the invention, a differential amplifier topology with true differential inputs and outputs is used to provide high common-mode noise rejection.

In a second exemplary aspect of the invention, a bipolar emitter follower (e.g., npn) in the circuit topology provides a low output impedance and output inductive peaking which nullifies the parasitic capacitance in the input circuit of the CTIA.

In another exemplary aspect of the invention, the CTIA differential output is buffered by the bipolar npn emitter follower in the CTIA feedback loop such that the open-loop high voltage gain is maintained without being affected by output load.

In yet another exemplary aspect of the invention, CTIA circuitry provides a wide bandwidth output while using less current than conventional all-FET CTIA circuit designs.

Figure 1:
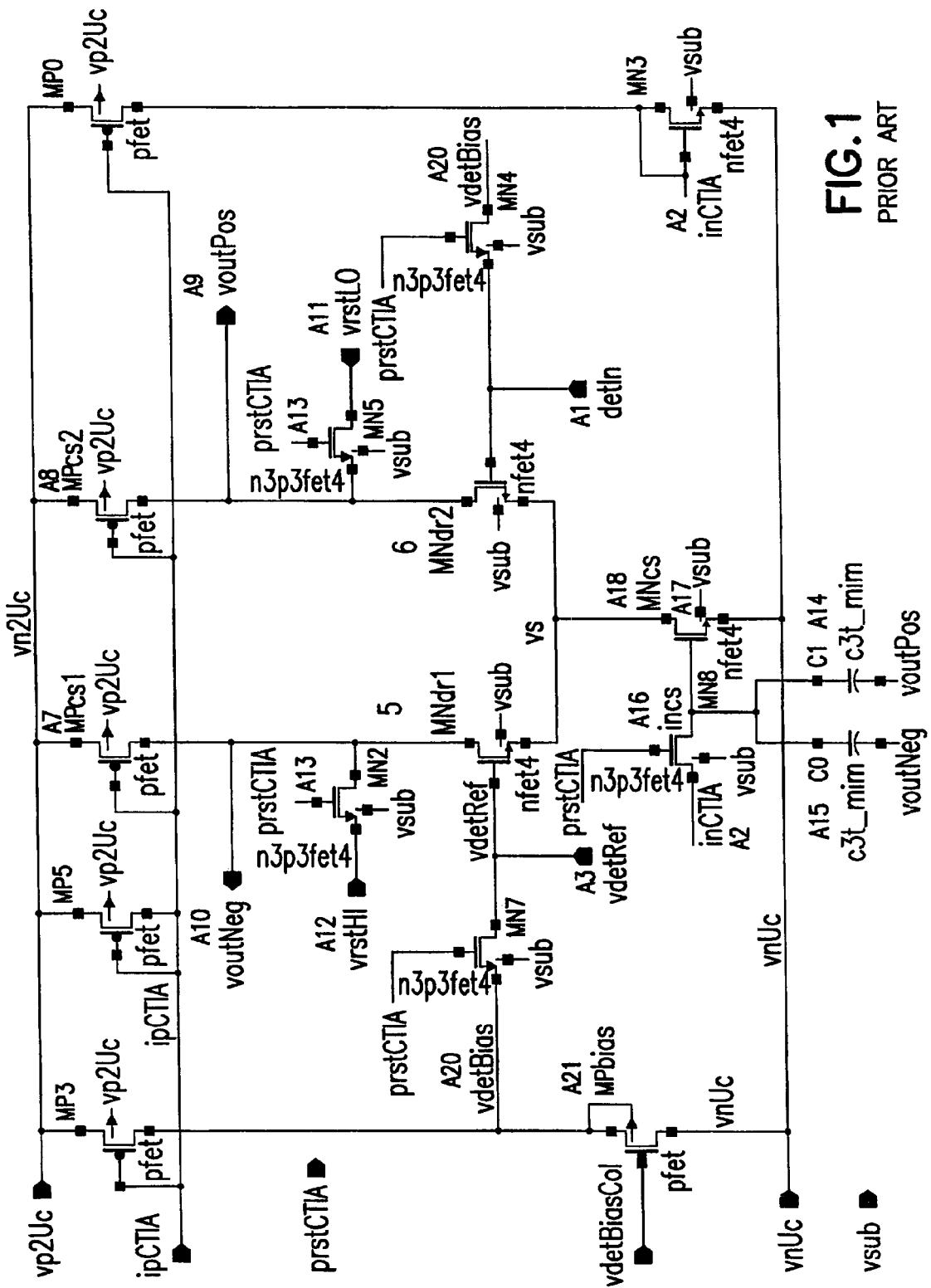
FIG. 1 shows a conventional CTIA using all field effect transistors (FETs).

Referring to the circuit illustrated in FIG. 1, there is shown a schematic diagram of the conventional CTIA design that uses all FETs.

In FIG. 1, the input, labeled detIn A1, is connected to a photodiode detector (not shown) which is assumed to sink out a photo-current at the CTIA input detIn1. The reference input, vdetRef A3, is connected to a reference voltage source through a capacitor Cdet (not shown) to match the detector parasitic capacitance. For a photodiode sourcing in a photo-current, the input vdetRef A3 is connected to the photodiode and the input detIn A1 in this case goes to a reference voltage source through capacitor Cdet.

The input differential pair of nfets MNdr1 A5 and MNdr2 A6 provide a high gain with active loads MPcs1 A7 and MPcs2 A8, and capacitive feedback via the drain to gate capacitances from the outputs voutPos A9 and voutNeg A10 to the inputs detIn A1 and vdetRef A3, respectively. The output DC biases are pre-set with vrstLO A11 and vrstHI A12 when the reset pulse prstCTIA A13 is asserted true (logic high) which also sets the tail current (the drain current of the nfet MNcs A18) with the nfet mirror current inCTIA A2 which is derived from the input bias current ipCTIA for the pfets. After the reset, the common mode feedback stabilizes the tail current with the feedback capacitors C1 A14 and C0 A15 from the output voltages voutPos A9 and voutNeg A10 to the common mode input incs A16 at the gate of the nfet MNcs A18.

Figure 2A:
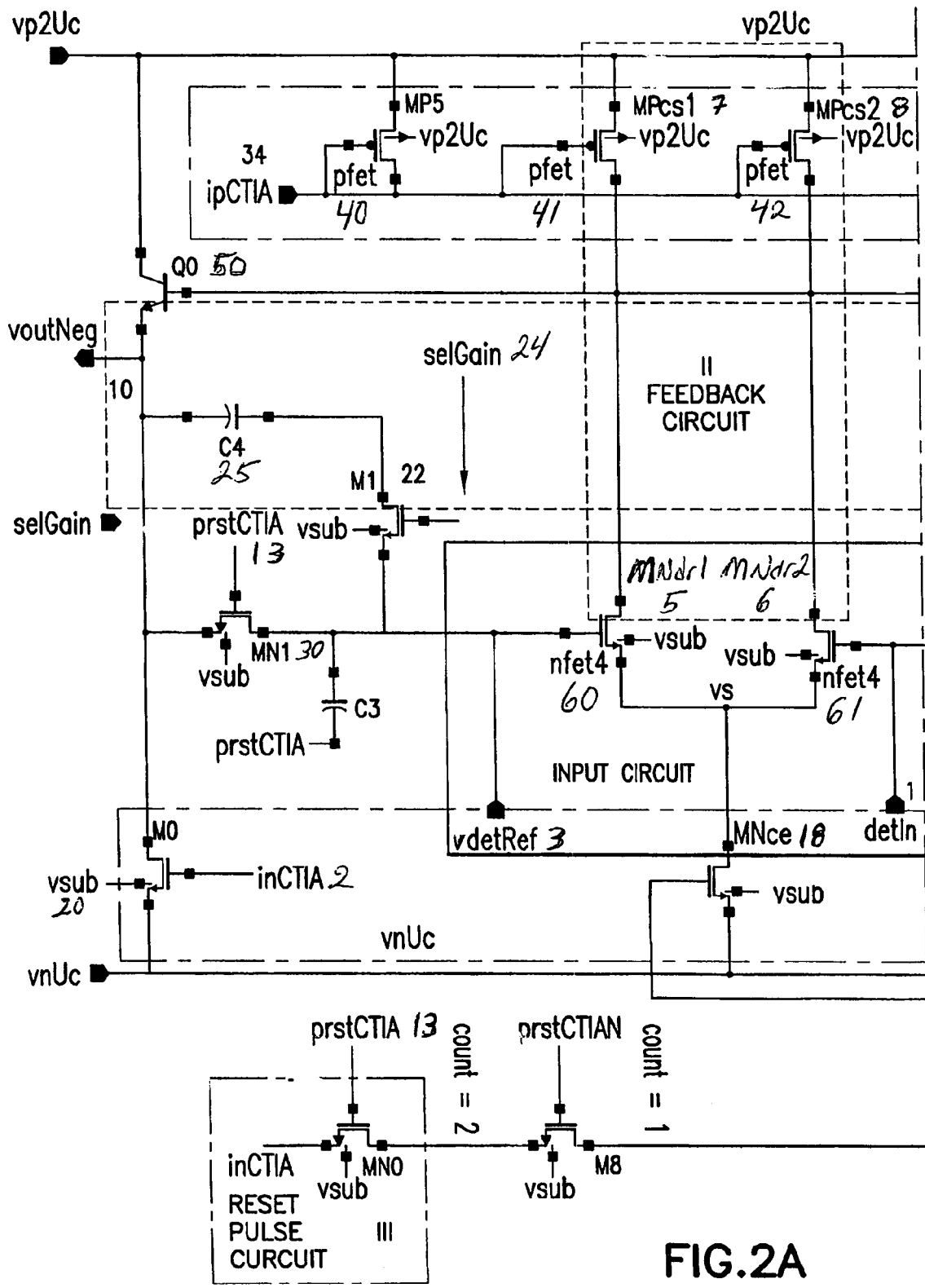
FIG. 2 shows an input pre-amplifier CTIA with bipolar emitter follower feedback.
Figure 2B:
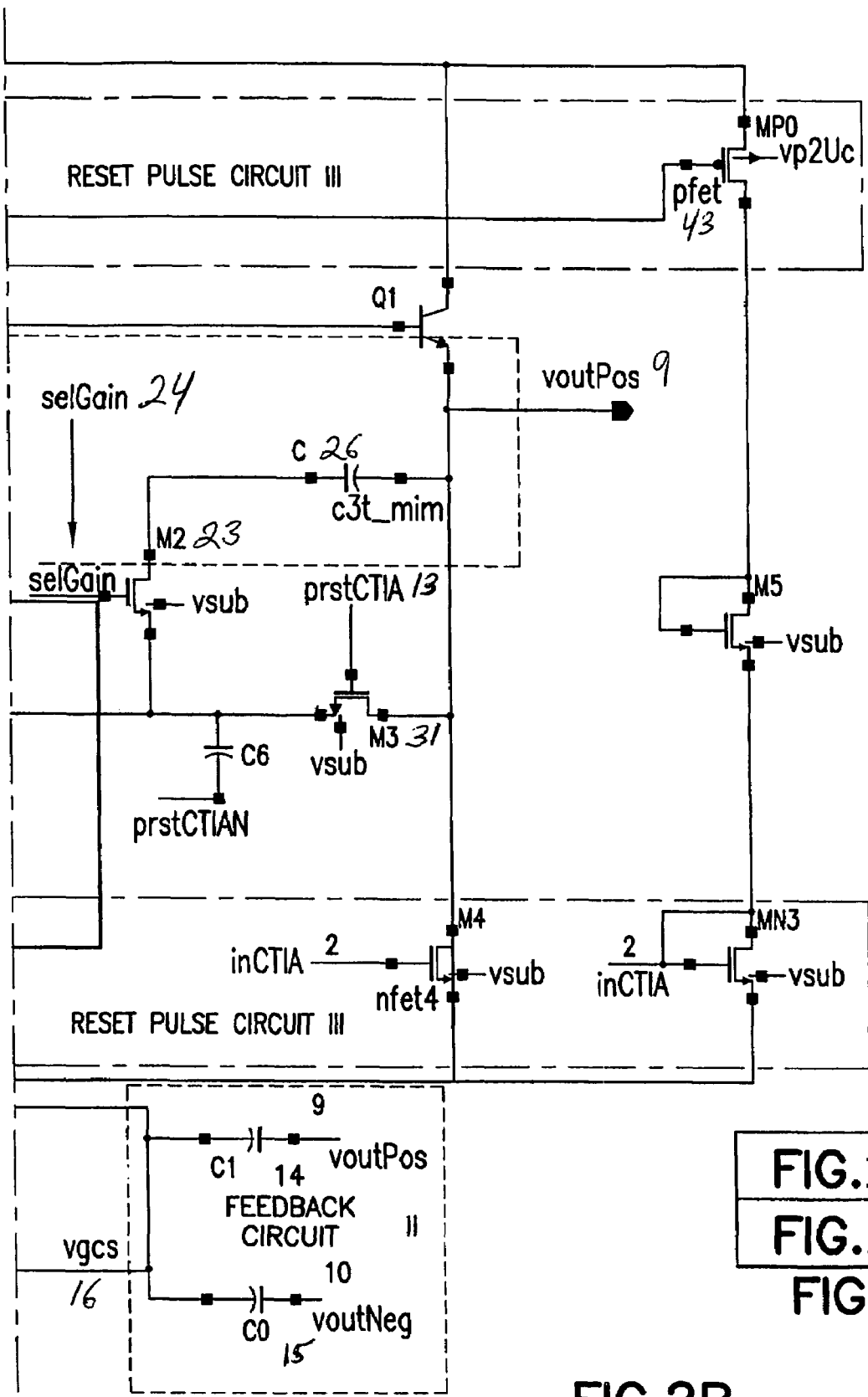

FIG. 2 illustrates a CTIA in accordance with an embodiment of this invention, more specifically, a differential amplifier topology with true differential inputs and outputs that is used to provide high common-mode noise rejection.

In FIG. 2, the areas of the circuit most closely corresponding to the Input circuit I, the Feedback circuit II, and the Reset Pulse circuit III are outlined in line or dash form for the benefit of the reader. Continuing with the detailed circuit description, in FIG. 2 the input, labeled detIn 1, is connected to a photodiode detector (not shown) which is assumed to sink out a photo-current at the CTIA input 2. The reference input, vdetRef 3, is connected to a reference voltage source through a capacitor Cdet (not shown) to match the detector parasitic capacitance. For a photodiode sourcing in a photo-current, the input vdetRef 3 will be connected to the photodiode and the input detIn 1 will then go to a reference voltage source through a capacitor Cdet.

The input differential pair of nfets MNdr1 5 and MNdr2 6 provide a high gain with active loads MPcs1 7 and MPcs2 8 and capacitive feedback via the drain to gate capacitances from the outputs voutPos 9 and voutNeg 10 to the inputs detIn 1 and vdetRef 3, respectively.

In accordance with an aspect of this invention, the outputs voutNeg 10 and voutPos 9 are coupled to the emitters of bipolar transistors Q0 50 and Q1 51, respectively. The output DC biases at the nfet4 60 and 61 are pre-set by the emitter follower circuit comprising the bipolar transistors Q0 50 and Q1 51 via the nfet switches MN1 30 and M3 31 which are turned on when the reset pulse prstCTIA 13 is asserted true (logic high). The reset pulse prstCTIA 13 also sets the tail current (the drain current of the nfet MNce 18) to be the nfet mirror current in CTIA 2 which is derived from the input bias current ipCTIA 34 for the pfets 40 through 43. Further, according to an aspect of this invention, pfet 43 is coupled to switch M5 whose emitter is coupled to switch MN3, and the emitter of switch MN3 is coupled to a voltage bus vnUC. In addition, nfets M0 and M4 are coupled to the emitters of bipolar transistors Q0 50 and Q1 51, respectively. Further, as illustrated in FIG. 2 there are references to substrate voltages vsub in various switches of the CTIA.

After the reset, the common mode feedback stabilizes the tail current with the feedback capacitors C1 14 and C0 15 from the output voltages voutPos 9 and voutNeg 10 to the common mode input vgcs 16 at the gate of the nfet MNce 18.

During the reset (when the input prstCTIA 13 is set true), the input DC voltages at detIn 1 and vdetRef 3 are set to be the input DC voltage inCTIA plus the gate to the source voltage vgcs.

In FIG. 2 there is a CTIA as in an exemplary embodiment of the present invention, wherein the Input CTIA has high gain (41 uV/el) with a bandwidth of 2.7 GHz, low noise (24 el) and low power (2.6 v*240 uA)@−100° C. (173° K). In FIG. 2, the feedback capacitors C4 25 and C5 26 are added in the feedback paths from the output nodes voutNeg 10 and voutPos 9 to the input nodes VdetRef 3 and detIn 1, respectively, when the FET switches M1 22 and M2 23 are turned on with the control signal selGain 24 set to logic True. This effectively reduces the amplifier gain and increases the amplifier bandwidth depending on the values of C4 25 and C5 26. Further, as an example, the capacitors C4 and C5 are set equal and may each have a value of 6 fF (femto-farad). Wherein, an increase in the value of C4 and C5 results in further reducing the gain and widening the bandwidth output of the amplifier. Conversely, a decrease in the value of C4 and C5 increases the gain and narrows the bandwidth output of the amplifier.

Figure 3:
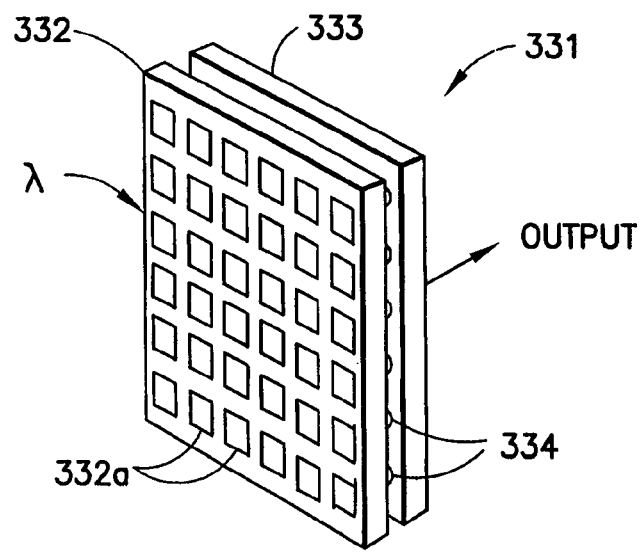
FIG. 3 is an illustrative view of a FPA of IR detectors coupled to an array of FPA readout devices.

Referring now to FIG. 3 it can be seen that an exemplary and non-limiting embodiment of an FPA 331 comprises an N (column) by M (row) mosaic array 332 of radiation detectors, such as IR detectors 332a. IR induced signals from each detector 332a of the array 332 are amplified, integrated, sampled and held by a sampling capacitor and multiplexed by a readout array 333. Typically, the arrays 332 and 333 are hybridized by a plurality of indium "bumps" 334.

In general, the readout multiplexing may be practiced by at least two techniques. One technique involves multiplexing each unit cell of the M'th column and subsequently multiplexing all N channels to provide a signal output from the array 333. A second technique involves multiplexing the M'th column, as above, then outputting each channel independently. This reduces multiplexing complexity but increases the number of outputs from array 333.

The drawing of FIG. 3 is illustrative only, it being realized that the number of IR detectors is variable over a wide range depending upon the required resolution and other factors for a given application.

Figure 4:
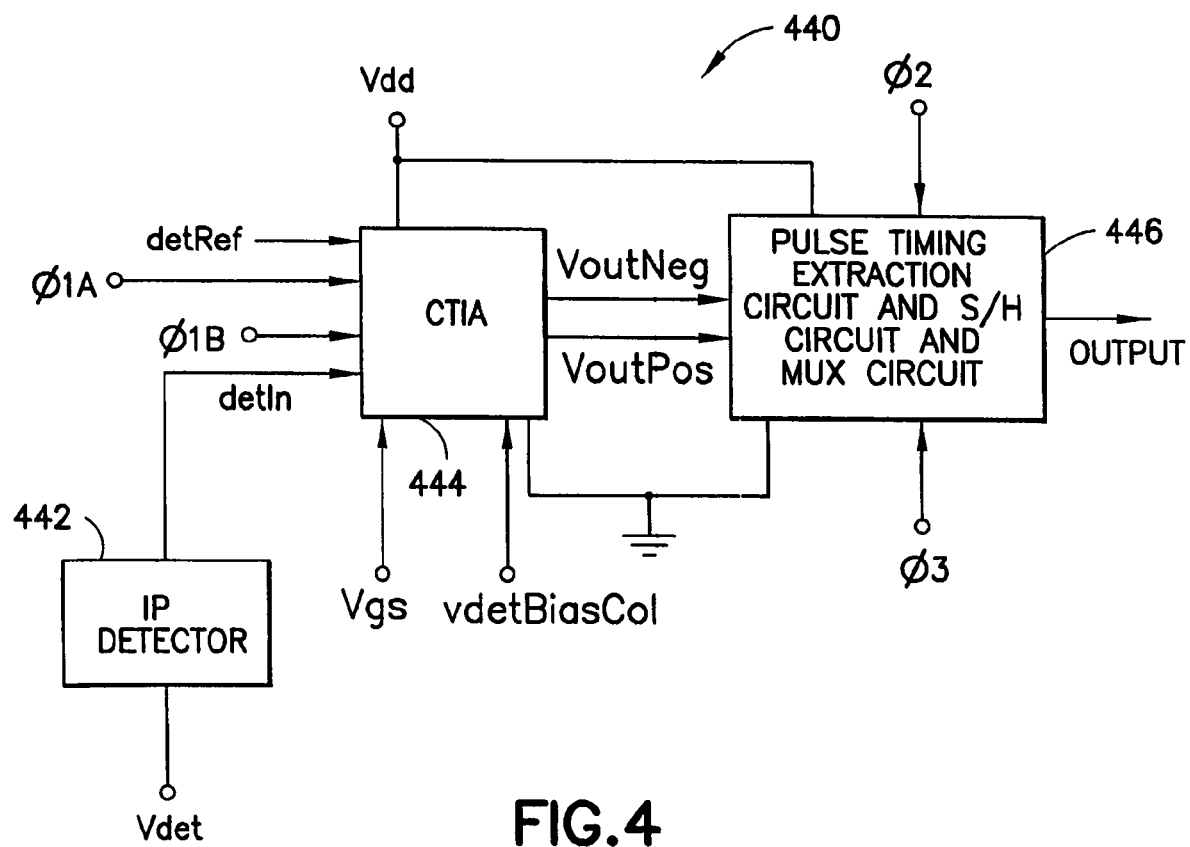
FIG. 4 is a block diagram showing a readout circuit unit cell comprising a CTIA.

Referring now to FIG. 4 there is illustrated in block diagram form a readout unit cell 440 of the array 333, the array 333 being comprised of a plurality of such readout unit cells, individual ones of which are coupled to a corresponding detector of the array 332. As can be seen, the readout unit cell 440 is comprised of a CTIA 444, which is constructed in accordance with the circuitry shown in FIG. 2. CTIA 444 may be utilized with either, but not limited to, a photovoltaic p-n or n-p or a photoconductive radiation detector 442. JR Detector 442 is generally biased to a desired operating point and is coupled to an input detln of the CTIA 444. The CTIA 444 is generally controlled by a plurality of clocks, such as the integration command clocks Phi 1A (or prstCTIA) and Phi 1B (or prstCTIAN). CTIA 444 may also be biased by voltages vgcs for current bias or ipCTIA, vdetBiasCol, and detRef. The CTIA 444 may be powered by a single power supply voltage (Vdd). The JR induced signal which is integrated by CTIA 444 is provided to a pulse timing extraction circuit, and an S/H and MUX circuit 446, which are controlled by clock Phi 2 and clock Phi 3, respectively. The multiplexed output of the S/H 446 is a unit cell sampled analog signal (OUTPUT).

Generally, various exemplary embodiments of the invention can be implemented in different mediums, such as software, hardware, logic, special purpose circuits or any combination thereof. As a non-limiting example, some aspects may be implemented in software which may be run on a computing device, while other aspects may be implemented in hardware.

Figure 5:
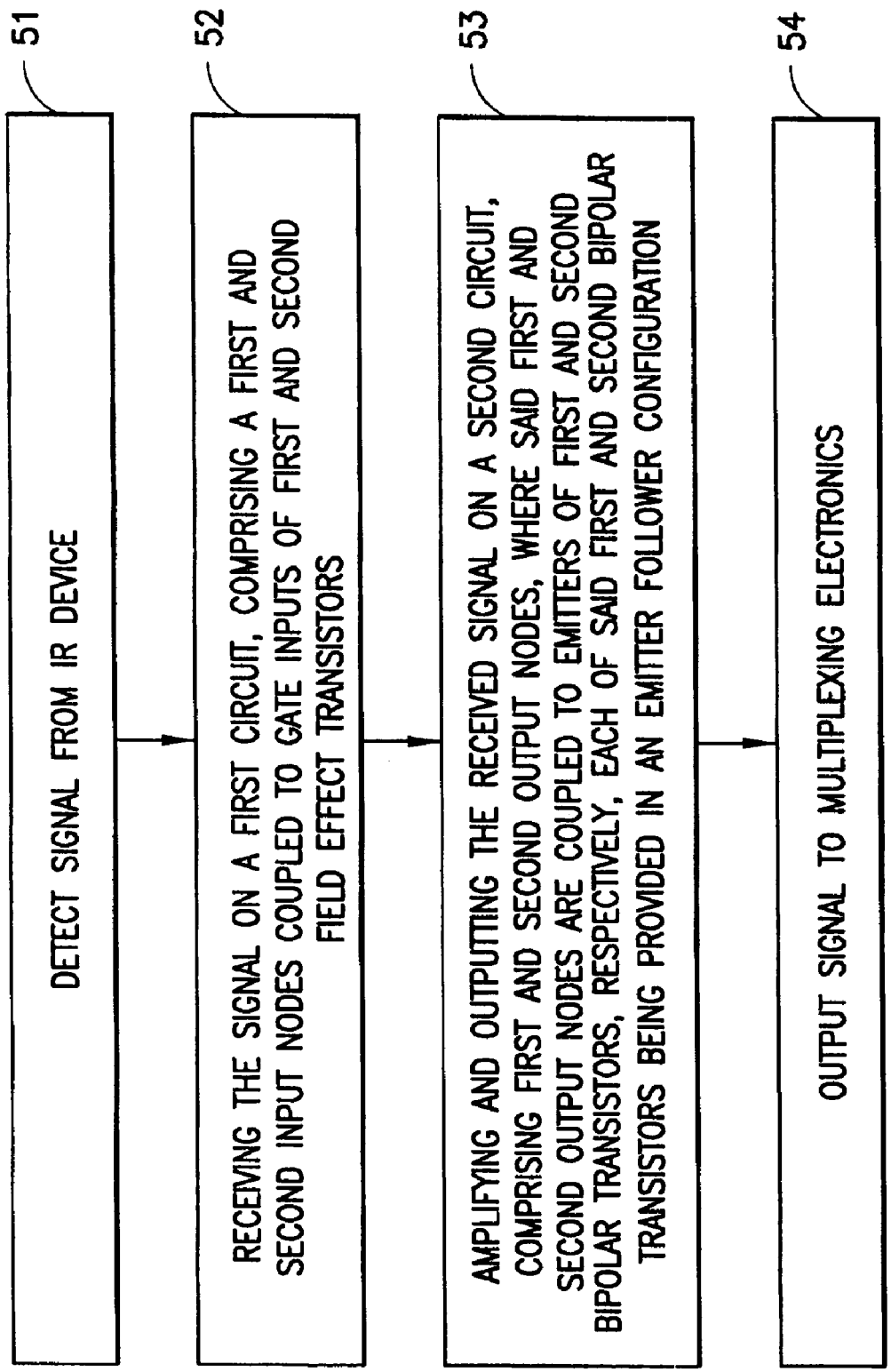
FIG. 5 is a flowchart of an exemplary aspect of the invention illustrated in method steps.

In FIG. 5 there is illustrated a method for performing a exemplary embodiment of the invention. As illustrated, a signal from an IR detector 51 is received on a first circuit 52, comprising a first and second input nodes coupled to gate inputs of first and second field effect transistors, and a second circuit 53 amplifies and outputs the received signal, wherein the second circuit comprises first and second output nodes, where said first and second output nodes are coupled to emitters of first and second bipolar transistors, respectively, and each of said first and second bipolar transistors being provided in an emitter follower configuration. Then the amplified signal is output to multiplexing electronics 54 for use in other devices such as a detector array.

The foregoing description has provided by way of exemplary and non-limiting examples a full and informative description of the exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A capacitive trans-impedance amplifier, comprising:
first and second input nodes coupled to gate inputs of first and second field effect transistors, respectively; and
first and second output nodes, where said first and second output nodes are coupled to emitters of first and second bipolar transistors, respectively, each of said first and second bipolar transistors being provided in an emitter follower configuration, wherein the emitters of the first and second bipolar transistors are further coupled to the gate inputs of the first and second field effect transistors, respectively.

2. The capacitive transimpedance amplifier of claim 1, further comprising first and second capacitances switchably coupled between said first and second output nodes and said first and second input nodes, respectively, for reducing gain and increasing bandwidth of the capacitive transimpedance amplifier when said first and second capacitances are coupled between said first and second output nodes and said first and second input nodes.

3. The capacitive transimpedance amplifier of claim 2, where the first and second capacitances are selectable for adjusting gain and bandwidth output of the capacitive transimpedance amplifier.

4. The capacitive transimpedance amplifier of claim 1, where one of said input nodes is coupled to a radiation detector, and the other of said input nodes is coupled to a reference voltage.

5. The capacitive transimpedance amplifier of claim 1, embodied in a readout integrated circuit that is hybridized with a focal plane array of radiation detectors.

6. The capacitive transimpedance amplifier of claim 1, wherein the emitters of first and second bipolar transistors are switchably coupled to gates of the first and second field effect transistors, respectively, for pre-setting the output DC bias of the first and second field effect transistors when said emitters of first and second bipolar transistors are coupled to the gates of the first and second field effect transistors, respectively.

7. A readout integrated circuit, comprising an array of capacitive transimpedance amplifiers individual ones of which comprise first and second input nodes coupled to gate inputs of first and second field effect transistors, respectively; and first and second output nodes, where said first and second output nodes are coupled to emitters of first and second bipolar transistors, respectively, each of said first and second bipolar transistors being provided in an emitter follower configuration.

8. The readout integrated circuit as in claim 7, where said individual ones of said capacitive transimpedance amplifiers each further comprise first and second capacitances switchably coupled between said first and second output nodes and said first and second input nodes, respectively, for reducing gain and increasing bandwidth of the capacitive transimpedance amplifier when said first and second capacitances are coupled between said first and second output nodes and said first and second input nodes.

9. The readout integrated circuit as in claim 8, where the first and second capacitances are selectable for adjusting gain and bandwidth output of the capacitive transimpedance amplifier.

10. The readout integrated circuit as in claim 7, where one of said input nodes is coupled to a radiation detector, and the other of said input nodes is coupled to a reference voltage.

11. The readout integrated circuit as in claim 7, further comprising a plurality of switch devices to periodically preset a DC bias potential of the first and second field effect transistors with the emitters of the first and second bipolar transistors.

12. The readout integrated circuit as in claim 7, wherein the emitters of first and second bipolar transistors are switchably coupled to gates of the first and second field effect transistors, respectively, for pre-setting the output DC bias of the first and second field effect transistors when said emitters of first and second bipolar transistors are coupled to the gates of the first and second field effect transistors, respectively.

13. A method, comprising:
receiving a signal on a first circuit, comprising a first and second input nodes coupled to gate inputs of first and second field effect transistors, respectively; and amplifying and outputting the received signal on a second circuit, comprising first and second output nodes, where said first and second output nodes are coupled to emitters of first and second bipolar transistors, respectively, each of said first and second bipolar transistors being provided in an emitter follower configuration, wherein the emitters of the first and second bipolar transistors are further coupled to the gate inputs of the first and second field effect transistors, respectively.

14. The method of claim 13, wherein the second circuit further comprises:

first and second capacitances switchably coupled between said first and second output nodes and said first and second input nodes, respectively, for reducing gain and increasing bandwidth of the capacitive transimpedance amplifier when said first and second capacitances are coupled between said first and second output nodes and said first and second input nodes, and where the first and second capacitances are selectable for adjusting gain and bandwidth output of the capacitive transimpedance amplifier.

15. The method of claim 13, wherein the first circuit further comprises one of said input nodes is coupled to a radiation detector, and the other of said input nodes is coupled to a reference voltage.

16. The method of claim 13, wherein the first and second circuit is embodied in a readout integrated circuit that is hybridized with a focal plane array of radiation detectors.

17. The method of claim 13, wherein the second circuit wherein the emitters of first and second bipolar transistors are switchably coupled to gates of the first and second field effect transistors, respectively, for pre-setting the output DC bias of the first and second field effect transistors when said emitters of first and second bipolar transistors are coupled to the gates of the first and second field effect transistors, respectively.

18. The method of claim 13, wherein the first and second capacitances are selectable for adjusting gain and bandwidth output of the capacitive transimpedance amplifier.

19. A capacitive trans-impedance amplifier, comprising:

means for receiving a signal on a first circuit, comprising a first and second input nodes coupled to gate inputs of first and second field effect transistors, respectively; and means for amplifying and outputting the received signal on a second circuit, comprising first and second output nodes, where said first and second output nodes are coupled to emitters of first and second bipolar transistors, respectively, each of said first and second bipolar transistors being provided in an emitter follower configuration, wherein the emitters of the first and second bipolar transistors are further coupled to the gate inputs of the first and second field effect transistors, respectively.

20. The capacitive trans-impedance amplifier of claim 19, wherein the means for receiving a signal on the first circuit comprises a receiver circuit; and the means for amplifying and outputting the received signal on the second circuit comprises an amplifier and feedback circuit.

* * * * *